United States Patent [19]
Sakura

[11] Patent Number: 5,925,902
[45] Date of Patent: Jul. 20, 1999

[54] SEMICONDUCTOR DEVICE HAVING A SCHOTTKY FILM WITH A VERTICAL GAP FORMED THEREIN

[75] Inventor: Naoki Sakura, Tokyo, Japan

[73] Assignee: Nec Corporation, Tokyo, Japan

[21] Appl. No.: 09/086,723

[22] Filed: May 29, 1998

[30] Foreign Application Priority Data

May 29, 1997 [JP] Japan .................................. 9-140385

[51] Int. Cl.⁶ .................................................. H01L 29/812
[52] U.S. Cl. ........................ 257/280; 257/283; 257/486; 438/422; 438/573; 438/578
[58] Field of Search ..................................... 257/471, 472, 257/485, 486, 283, 280; 438/284, 422, 423, 573, 574, 578, 579, FOR 177

[56] References Cited

U.S. PATENT DOCUMENTS 4,618,510  10/1986  Tan .............................................. 427/89

*Primary Examiner*—David B. Hardy
*Attorney, Agent, or Firm*—Foley & Lardner

[57] ABSTRACT

In a semiconductor device, a gate electrode is formed by sequentially forming a Schottky metal film, a barrier metal film, and a low-resistance metal film from the lower side. The Schottky metal film or barrier metal film has a gap in a lower gate vertical portion. The gap is closed at its upper and lower portions. The overlaying low-resistance metal film does not extend into the lower gate vertical portion. A method for this semiconductor device is also disclosed.

2 Claims, 8 Drawing Sheets

SEMICONDUCTOR DEVICE HAVING A SCHOTTKY FILM WITH A VERTICAL GAP FORMED THEREIN

BACKGROUND OF THE INVENTION

1. Field of the Invention

The present invention relates to a semiconductor device and a method of manufacturing the same and, more particularly, to a semiconductor device having a microelectrode and a method of manufacturing the same.

2. Description of the Prior Art

Conventionally, in a process of forming the gate electrode of a GaAs FET (Field Effect Transistor), a technique of forming a gate electrode having a T-shaped section by filling an oxide film opening pattern with a metal film is used to reduce the gate length while lowering the gate resistance and the capacitance between the gate substrates.

The structure of the conventional semiconductor device in which the gate electrode is formed by burying an electrode, and the steps of the conventional manufacturing method will be described below.

FIGS. 1E and 2 show an example of the gate electrode structure of the conventional semiconductor device.

A Schottky metal film 76, a barrier metal film 77, and a low-resistance metal film 78 are sequentially formed from the lower side in a pattern opening portion having a width of 0.2 µm. The Schottky metal film 6 is 100 nm thick, and the barrier metal film 77 is 2,000 nm thick on the flat portion except the pattern opening portion. On the bottom portion in the pattern opening portion, however, the Schottky metal film 76 is only 10 nm thick, and the barrier metal film 77 is only 20 nm thick.

The low-resistance metal film 78 extends into a gate vertical portion 82, so the distance to the Schottky interface between the Schottky metal film 76 and a substrate operation layer 72 is about 30 nm. This is because the metal film thickness decreases in the small pattern opening portion.

FIGS. 1A to 1E are sectional views showing the steps in the manufacture of the gate electrode of the conventional semiconductor device.

The gate oxide film 72 is formed on a semi-insulating substrate 71, and then, a first insulating film 73 is formed. A resist film 74 is applied onto the first insulating film 73 and subjected to exposure and development to form a pattern opening portion 80 (FIG. 1A).

The first insulating film 73 is selectively removed by anisotropic dry etching using the opening pattern of the resist film 74 as a mask, thereby forming a gate opening pattern. After this, the resist film 74 is removed (FIG. 1B).

A second insulating film 75 is formed on the entire surface of the first insulating film 73. Since the second insulating film 75 also forms on the side wall of the opening portion, the size of the opening portion is reduced (FIG. 1C).

The entire surface is etched back by dry etching to expose the gate oxide film 72, thereby forming the gate opening pattern (FIG. 1D).

The Schottky metal film 76, the barrier metal film 77, and the low-resistance metal film 78 are sequentially formed on the entire surface. The metal films 76, 77, and 78 are selectively removed by ion milling and dry etching using, as a mask, a resist pattern formed on the pattern opening portion, thereby obtaining a T-shaped gate electrode 81 (FIGS. 1E and 2). FIG. 1E is an enlarged view of a section taken along a line IE—IE in FIG. 2.

In the conventional method, the barrier metal film having a sufficient thickness must be inserted between the Schottky metal film and the low-resistance metal film. However, since the barrier metal film cannot obtain a sufficient thickness in the pattern opening portion, the metal of the low-resistance metal film diffuses into the substrate through the Schottky interface. This degrades the Schottky characteristics, resulting in the problem of low reliability of the FET.

The reason for this is as follows. The thickness of the barrier metal film formed by sputtering or the like becomes smaller on the bottom portion in the gate opening portion having a trench structure than that on the flat portion other than the pattern opening portion because of the shielding effect from the metal film which has already been formed.

SUMMARY OF THE INVENTION

The present invention has been made in consideration of the above situation in the prior art, and has as its object to provide a semiconductor device which allows reduction of the probability of degradation in Schottky characteristics of a FET, decrease the number of processes, and forming a gate metal film using sputtering or deposition, and a method of manufacturing the same.

The above object is achieved by the following aspects of the present invention.

According to the first aspect of the present invention, there are provided a semiconductor device having a structure in which a gate electrode is formed by sequentially forming a Schottky metal film, a barrier metal film, and a low-resistance metal film from a lower side, wherein the Schottky metal film or barrier metal film has a gap in a lower gate vertical portion, the gap is closed at upper and lower portions, and the overlaying low-resistance metal film does not extend into the lower gate vertical portion, and a method of manufacturing the semiconductor device.

According to the second aspect of the present invention, there are provided a semiconductor device having a structure in which a gate electrode is formed by sequentially forming a Schottky metal film and a low-resistance metal film from a lower side, wherein the Schottky metal film has a gap in a lower gate vertical portion, the gap is closed at upper and lower portions, and the overlaying low-resistance metal film does not extend into the lower gate vertical portion, and a method of manufacturing the semiconductor device.

In the semiconductor device according to the first aspect of the present invention, in the gate electrode of the field effect transistor constituted by the Schottky metal film, the barrier metal film, and the low-resistance metal film, the gap surrounded by the Schottky metal film and the barrier metal film is present in the lower gate vertical portion, and the gap is closed at its upper portion by the barrier metal film. Therefore, the overlaying low-resistance metal film does not extend into the gate vertical portion.

In the semiconductor device according to the second aspect of the present invention, in the gate electrode of the field effect transistor constituted by the Schottky metal film and the low-resistance metal film, the gap surrounded by the Schottky metal film is present in the lower gate vertical portion, and the gap is closed at its upper portion by the Schottky metal film. Therefore, the barrier metal film and the overlaying low-resistance metal film do not enter the gate vertical portion.

The method of manufacturing the semiconductor device according to the first aspect of the present invention comprises the steps of forming an insulating film on a gate oxide film formed on a semi-insulating substrate, selectively dry-etching the insulating film using a resist pattern as a mask to form a pattern opening portion having a high aspect ratio, forming a Schottky metal film, forming a barrier metal film, and forming a low-resistance metal film.

In the step of filling the pattern opening portion having a vertical portion on the lower side with the metal film to form a gate electrode, the Schottky metal film is formed to have a uniform thickness on the side wall and bottom portions of the pattern opening portion. After this, the barrier metal film is formed to be particularly thick on the side wall portion of the pattern opening portion. With this process, the pattern opening portion is closed at its upper portion, thereby forming a barrier metal film having a gap in the gate vertical portion.

Alternatively, the Schottky metal film is formed to be particularly thick on the side wall portion of the pattern opening portion. With this process, the pattern opening portion is closed at its upper portion, thereby forming a Schottky metal film having a gap in the gate vertical portion.

Since a certain distance can be ensured between the GaAs substrate and the low-resistance metal film because of the gap in the barrier metal film or Schottky metal film, and the low-resistance metal can be prevented from diffusing into the Schottky interface, the characteristics of the FET are minimally degraded.

As is apparent from the above aspects, since the low-resistance metal film is separated from the Schottky interface, probability of degradation in Schottky characteristics of the FET due to diffusion of the low-resistance metal into the substrate can be reduced, resulting in an increase in reliability.

The barrier metal film may be made thinner or may be omitted. For this reason, the process can be shortened to result in improved productivity.

Since metal filling corresponding to the high aspect ratio need not be performed, the conventional metal film forming technique, i.e., sputtering or deposition using an inexpensive apparatus can be used to form the gate electrode.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Some preferred embodiments of the present invention will be described below in detail with reference to the accompanying drawings.

Figure 1A:
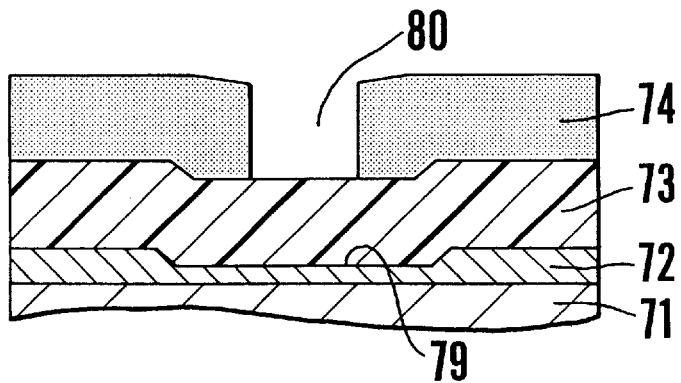
FIGS. 1A to 1E are sectional views showing the steps in a conventional manufacturing method.
Figure 1B:
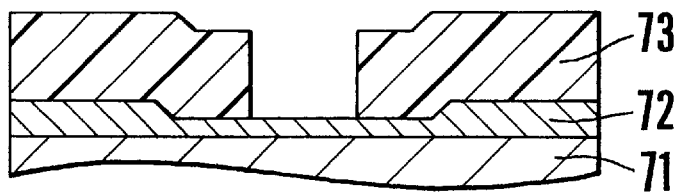
Figure 1C:
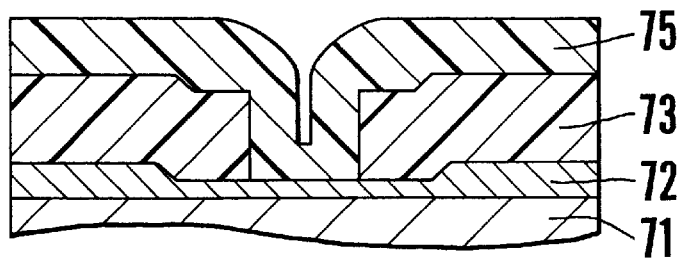
Figure 1D:
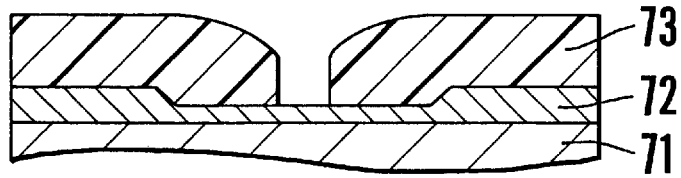
Figure 1E:
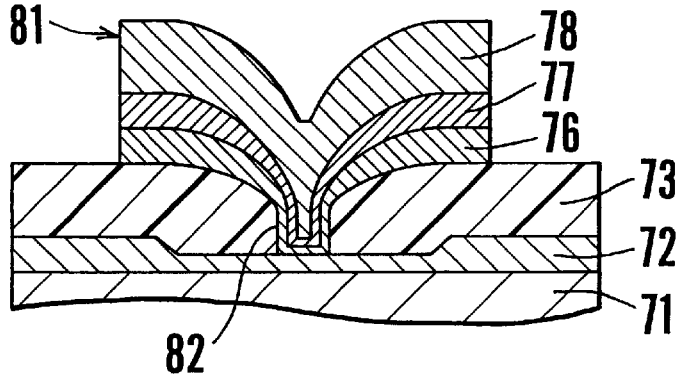
Figure 2:
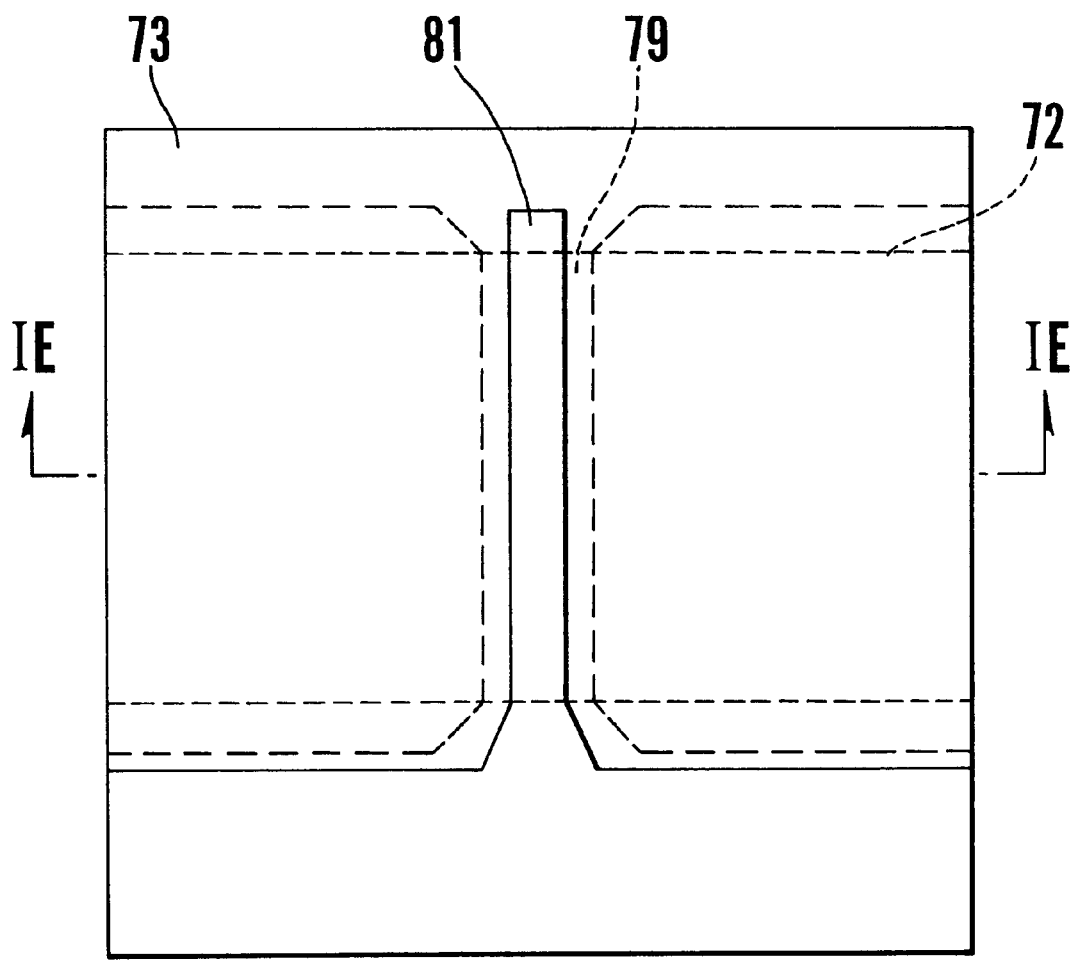
FIG. 2 is a schematic plan view showing the prior art.
Figure 3A:
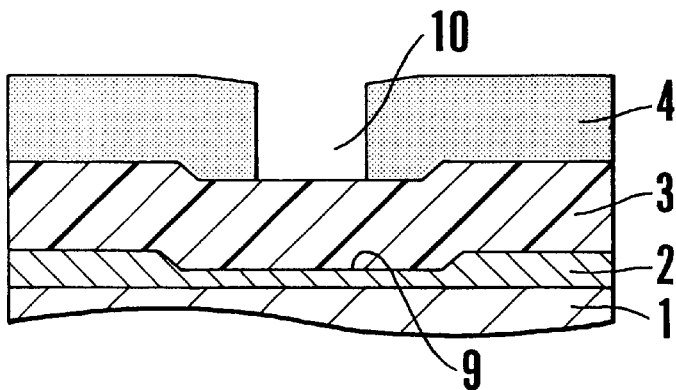
FIGS. 3A to 3E are sectional views showing the steps according to the first embodiment of the present invention.

In the first embodiment of the present invention, as shown in FIG. 3A, a gate oxide film 2 is formed on a semi-insulating substrate 1. The gate oxide film 2 is selectively removed using a resist pattern as a mask to adjust the thickness, thereby forming a recessed step 9. A first insulating film 3 is formed, and a pattern opening portion 10 is formed in a resist film 4.

Figure 3B:
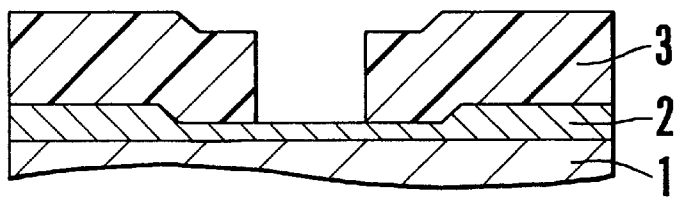

As shown in FIG. 3B, the first insulating film 3 is selectively patterned by dry etching using the resist film 4 as a mask to transfer the pattern opening portion 10. The resist film 4 is removed.

Figure 3C:
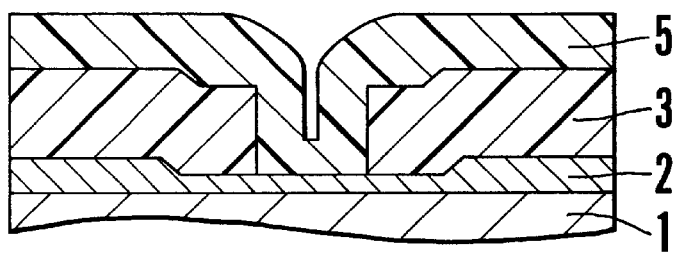

As shown in FIG. 3C, a second insulating film 5 is formed on the entire surface. The size of the pattern opening portion 10 is reduced using the fact that the second insulating film 5 also forms on the side wall of the opening portion.

Figure 3D:
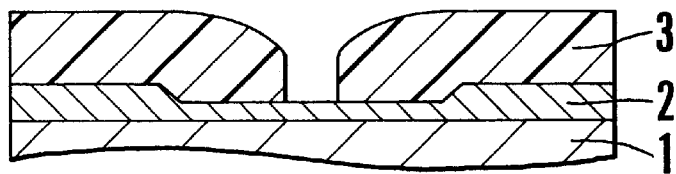

As shown in FIG. 3D, the second insulating film 5 is etched back across the wafer surface by dry etching to expose the gate oxide film 2 to the inner bottom portion of the pattern opening portion 10.

A Schottky metal film 6, a barrier metal film 7, and a low-resistance metal film 8, which form a gate electrode, are sequentially formed on the entire surface by sputtering.

The Schottky metal film 6 is required to be thermally stable and not to cause mutual diffusion with the gate oxide film 2 on the substrate. The Schottky metal film 6 is formed to have almost the same thickness on the bottom and side wall portions of the pattern opening portion 10.

The barrier metal film 7 formed on the Schottky metal film 6 prevents the low-resistance metal film 8 on the barrier metal film 7 from diffusing into the Schottky metal film 6 and the gate oxide film 2. The barrier metal film 7 is formed to be particularly thick at the upper side wall portion of the pattern opening portion 10 having a trench structure such that the opening width narrows down until it completely closes the opening.

The low-resistance metal film 8 is used to reduce the gate resistance and must have sufficiently low electrical resistance characteristics and large thickness.

Only the Schottky metal film 6 and the barrier metal film 7 are formed in a gate vertical portion 12, and a gap 13 is formed at the center of the gate vertical portion 12. The gap 13 is closed at its upper portion by the barrier metal film 7, so the low-resistance metal film 8 formed on the barrier metal film 7 does not extend into the gate vertical portion.

Figure 3E:
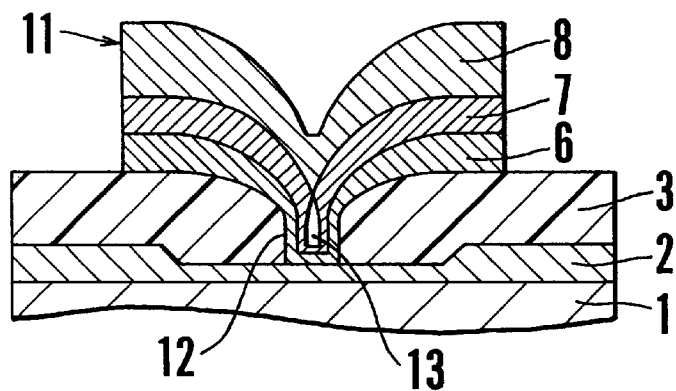

Unnecessary portions of the Schottky metal film 6, the barrier metal film 7, and the low-resistance metal film 8 are sequentially selectively removed by etching using a resist pattern as a mask, thereby obtaining a T-shaped gate electrode 11, as shown in FIG. 3E. FIG. 3E is an enlarged view of a section taken along a line IIIE—IIIE in FIG. 4.

Figure 5A:
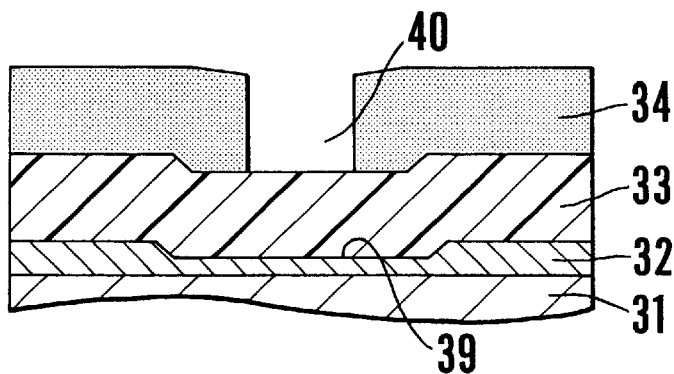
FIGS. 5A to 5E are sectional views showing the steps according to the second embodiment of the present invention.

In the second embodiment of the present invention, as shown in FIG. 5A, a gate oxide film 32 is formed on a semi-insulating substrate 31. The gate oxide film 32 is selectively removed using a resist pattern as a mask to adjust the thickness, thereby forming a recessed step 39. A first insulating film 33 is formed, and a pattern opening portion 40 is formed in a resist film 34.

Figure 5B:
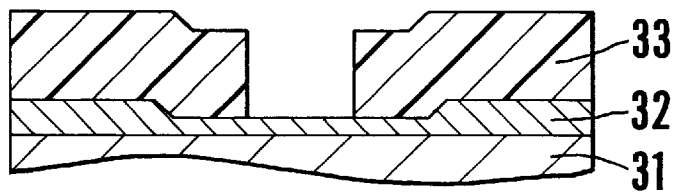

As shown in FIG. 5B, the first insulating film 33 is selectively patterned by dry etching using the resist film 34 as a mask to transfer the pattern opening portion 40, and the resist film 34 is removed.

Figure 5C:
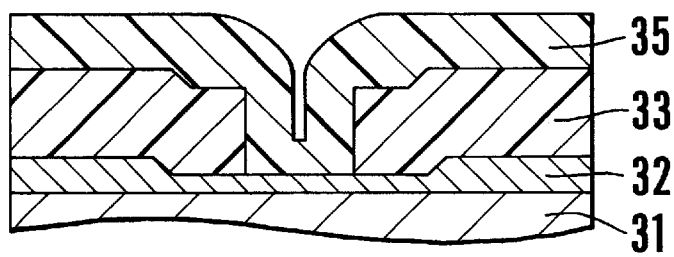

As shown in FIG. 5C, a second insulating film 35 is formed on the entire surface. The size of the pattern opening portion 40 is reduced using the fact that the second insulating film 35 forms on the side wall of the opening portion.

Figure 5D:
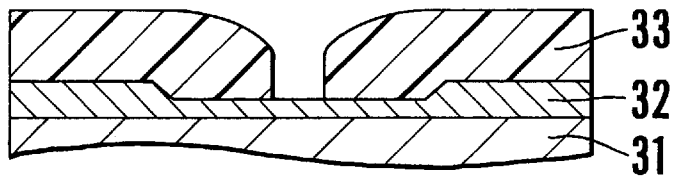

As shown in FIG. 5D, the second insulating film 35 is etched back across the wafer by dry etching to expose the gate oxide film 32 to the inner bottom portion of the pattern opening portion 40.

A Schottky metal film 36, a barrier metal film 37, and a low-resistance metal film 38, which construct a gate electrode, are sequentially formed on the entire surface by sputtering.

The Schottky metal film 36 is required to be thermally stable and not to cause mutual diffusion with the gate oxide film 32 on the substrate. The Schottky metal film 36 is formed to be particularly thick at the upper side wall portion of the pattern opening portion 40 having a trench structure such that the opening width narrows down until it completely closes the opening.

The barrier metal film 37 formed on the Schottky metal film 36 prevents the low-resistance metal film 38 on the barrier metal film 37 from diffusing into the Schottky metal film 36 and the gate oxide film 32. The barrier metal film 37 is formed to have almost the same thickness on the bottom and side wall portions of the pattern opening portion 40.

The low-resistance metal film 38 is used to reduce the gate resistance and must have sufficiently low electrical resistance characteristics and large thickness.

Only the Schottky metal film 36 and the barrier metal film 37 are formed in a gate vertical portion 42, and a gap 43 is formed at the center of the gate vertical portion 42. The gap 43 is closed at its upper portion by the barrier metal film 37, so the low-resistance metal film 38 formed on the barrier metal film 37 does not extend into the gate vertical portion 42.

Figure 5E:
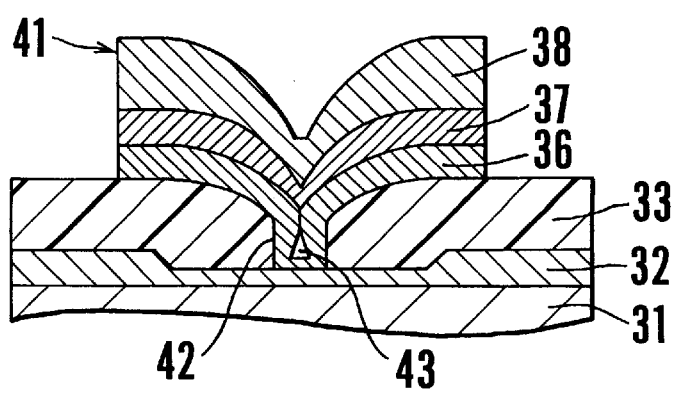

Unnecessary portions of the Schottky metal film 36, the barrier metal film 37, and the low-resistance metal film 38 are sequentially selectively removed by etching using a resist pattern as a mask, thereby obtaining a T-shaped gate electrode 41, as shown in FIG. 5E. FIG. 5E is an enlarged view of a section taken along a line VE—VE in FIG. 6.

The embodiments of the present invention will be described next in more detail with reference to the accompanying drawings.

In the first embodiment of the present invention, as shown in FIG. 3A, a gate oxide film 2 is formed on a semi-insulating substrate 1 consisting of GaAs by epitaxial growth or ion implantation. After this, the gate oxide film 2 is selectively removed by wet etching using the resist pattern as a mask to obtain an appropriate thickness, thereby forming a recessed step 9.

This recessed step 9 is e.g., 100 nm deep.

A first insulating film 3 consisting of an $SiO_2$ film is formed to a thickness of about 40 nm. A resist film 4 is applied, exposed, and developed to form a pattern opening portion 10. The size of the pattern opening portion 10 is, e.g., 0.5 $\mu$m.

As shown in FIG. 3B, the first insulating film 3 is selectively patterned by dry etching using the resist film 4 as a mask to transfer the pattern opening portion 10, and the resist film 4 is removed.

As shown in FIG. 3C, a second insulating film 5 consisting of an $SiO_2$ film and having a thickness of about 40 nm is formed on the entire surface. The size of the pattern opening portion 10 is reduced using the fact that the second insulating film 5 forms on the side wall of the opening portion. At this time, the size of the pattern opening portion 10 of this embodiment becomes approximately 0.2 $\mu$m.

As shown in FIG. 3D, the second insulating film 5 is etched back across the wafer by dry etching to expose the gate oxide film 2 to the inner bottom portion of the pattern opening portion.

A Schottky metal film 6, a barrier metal film 7, and a low-resistance metal film 8, which form the gate electrode, are sequentially formed on the entire surface by sputtering.

In this embodiment, a WSi film having a thickness of 100 nm is formed as the Schottky metal film 6. The Schottky metal film 6 is formed to have roughly the same thickness on the bottom and side wall portions of the pattern opening portion. For example, sputtering in a low vacuum is used.

As the barrier metal film 7, a TiN film having a thickness of 200 nm is formed. The barrier metal film 7 is formed to be particularly thick at the upper side wall portion of the pattern opening portion 10 having a trench structure such that the opening width narrows down at that portion. For example, sputtering with a small distance between the sputtering source and the wafer on which the film is to be formed is used to increase the sputtering particles, which become incident on the wafer at a small angle.

The barrier metal film 7 is formed from Au to have a thickness of 500 nm by sputtering or plating.

Figure 4:
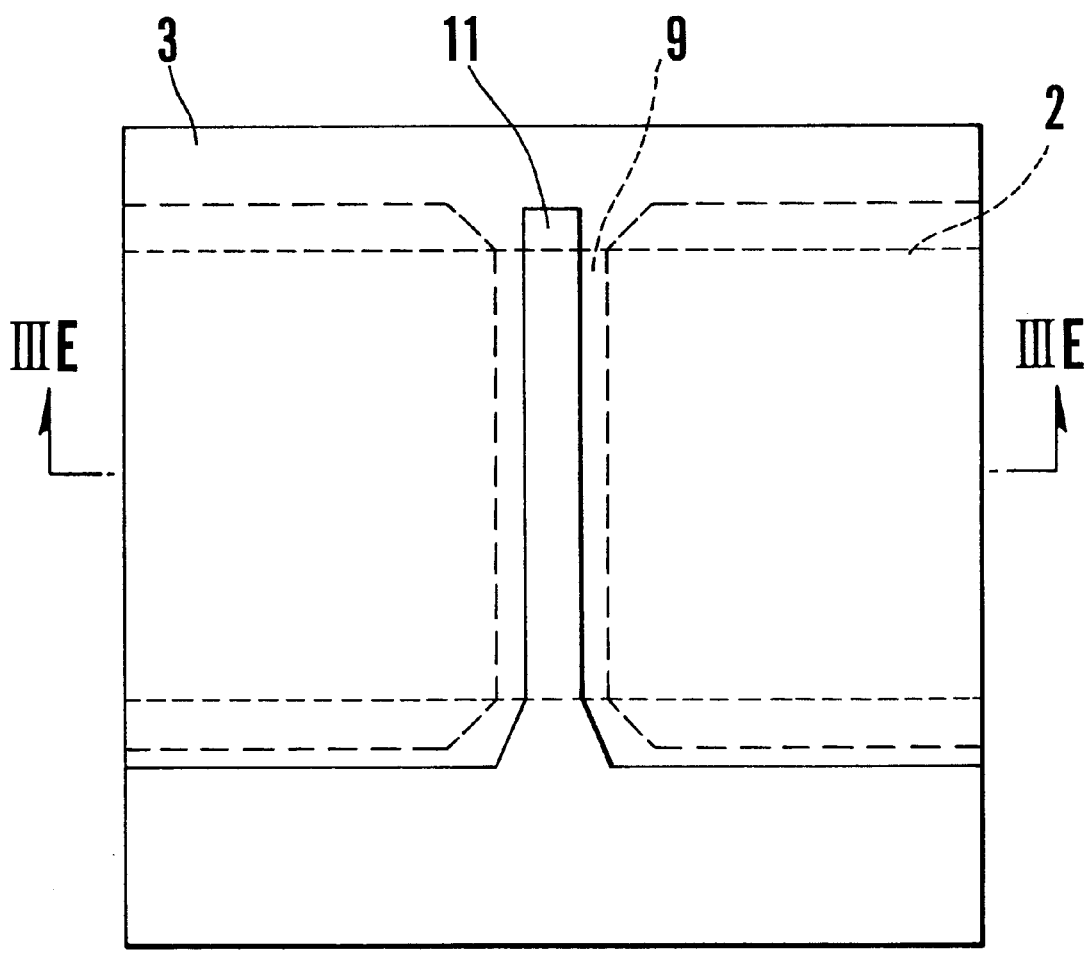
FIG. 4 is a schematic plan view showing the first embodiment of the present invention.

Unnecessary portions of the Schottky metal film 6, the barrier metal film 7, and the low-resistance metal film 8 are sequentially selectively removed by ion milling and dry etching using a resist pattern as a mask, thereby obtaining a T-shaped gate electrode 11, as shown in FIGS. 3E and 4.

The structure of the electrode formed by the method of this embodiment is shown in FIGS. 3E and 4.

In this embodiment, a gate vertical portion 12 has a gate length of 200 nm, a height of 200 nm, and an aspect ratio of roughly 1:1. Only the Schottky metal film 6 and the barrier metal film 7 are formed in the gate vertical portion 12, and a gap 13 having a width of 70 nm and a height of 150 nm is formed at the center of the gate vertical portion 12. The gap 13 is closed at its upper and lower portions by the barrier metal film 7, so the low-resistance metal film 8 on the barrier metal film 7 does not extend into the gate vertical portion 12.

In the second embodiment of the present invention, as shown in FIG. 5A, a gate oxide film 32 is formed on a semi-insulating substrate 31 consisting of GaAs by epitaxial growth or ion implantation. The gate oxide film 32 is selectively removed by wet etching using a resist pattern as a mask to obtain an appropriate thickness, thereby forming a recessed step 39. The recessed step 39 is, e.g., 100 nm deep.

A first insulating film 33 consisting of an $SiO_2$ film and having a thickness of about 40 nm is formed. A resist film 34 is applied, exposed, and developed to form a pattern opening portion 40. The size of the pattern opening portion 40 is, e.g., 0.5 $\mu$m.

As shown in FIG. 5B, the first insulating film 33 is selectively patterned by dry etching using $SF_6$ gas and, as a mask, the resist film 4 to transfer the pattern opening portion 40, and the resist film 34 is removed.

As shown in FIG. 5C, a second insulating film 35 consisting of an $SiO_2$ film is formed on the entire surface to have a thickness of about 40 nm. The size of the pattern opening portion 40 is reduced using the fact that the second insulating film 35 forms on the side wall of the opening portion. At this time, the size of the pattern opening portion 40 of this embodiment becomes about 0.2 $\mu$m.

As shown in FIG. 5D, the second insulating film 35 is etched back across the wafer by dry etching to expose the gate oxide film 32 to the inner bottom portion of the pattern opening portion 40.

A Schottky metal film 36, a barrier metal film 37, and a low-resistance metal film 38, which construct the gate electrode, are sequentially formed on the entire surface by sputtering.

In this embodiment, a WSi film having a thickness of 200 nm is formed as the Schottky metal film 36. The Schottky metal film 36 is formed to be particularly thick at the upper side wall portion of the pattern opening portion 40 having a trench structure such that the opening width narrows down at that portion. For example, sputtering with a small distance between the sputtering source and the wafer on which the film is to be formed is used to increase the sputtering particles which become incident on the wafer at a small angle.

As the barrier metal film 37, a TiN film having a thickness of 100 nm is formed by, e.g., sputtering. In this embodiment, the barrier metal film 7 may be thinner or may be omitted.

The low-resistance metal film 38 is formed from Au to have a thickness of 500 nm by sputtering or plating.

Figure 6:
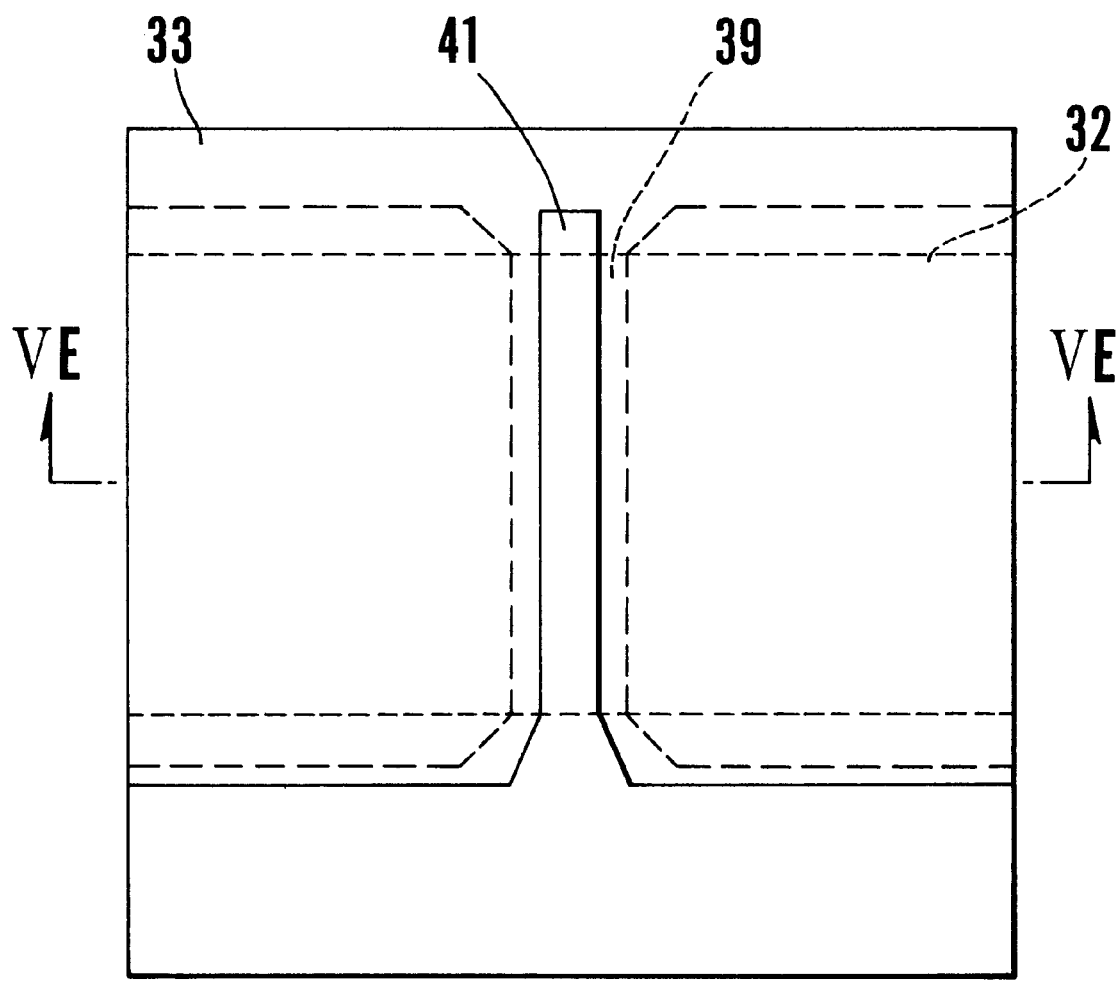
FIG. 6 is a schematic plan view showing the second embodiment of the present invention.

Unnecessary portions of the Schottky metal film 36, the barrier metal film 37, and the low-resistance metal film 38 are sequentially selectively removed by ion milling and dry etching using a resist pattern as a mask, thereby obtaining a T-shaped gate electrode 41, as shown in FIGS. 5E and 6.

The structure of the electrode formed by the method of this embodiment is shown in FIGS. 5E and 6. In this embodiment, a gate vertical portion 42 has a gate length of 200 nm, a height of 200 nm, and an aspect ratio of roughly 1:1.

Only the Schottky metal film 36 is formed in the gate vertical portion 42, and a gap 43 having a width of 100 nm and a height of 150 nm is formed at the center of the gate vertical portion 42. The gap 43 is closed at its upper and lower portions by the Schottky metal film 36, so the barrier metal layer 37 and the low-resistance metal film 38 on the Schottky metal film 36 do not extend into the gate vertical portion 42.

Figure 7A:
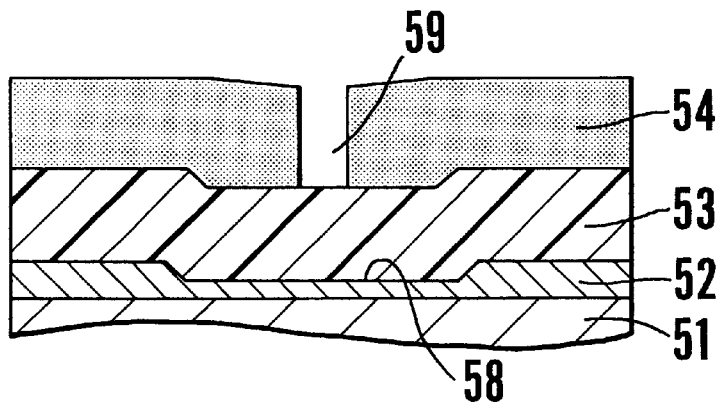
FIGS. 7A to 7C are sectional views showing the steps according to the third embodiment of the present invention.

In the third embodiment of the present invention, as shown in FIG. 7A, a gate oxide film 52 is formed on a semi-insulating substrate 51 consisting of GaAs by epitaxial growth or ion implantation. The gate oxide film 32 is selectively removed by wet etching using a resist pattern as a mask to obtain an appropriate thickness, thereby forming a recessed step 58. The recessed step 58 is, e.g., 100 nm deep.

An insulating film 53 consisting of an $SiO_2$ film and having a thickness of about 400 nm is formed. A positive resist film 54 is applied, exposed and developed using an electron beam pattern exposure apparatus or the like to form a pattern opening portion 59. The size of the pattern opening portion 59 is, e.g., 0.15 $\mu$m.

Figure 7B:
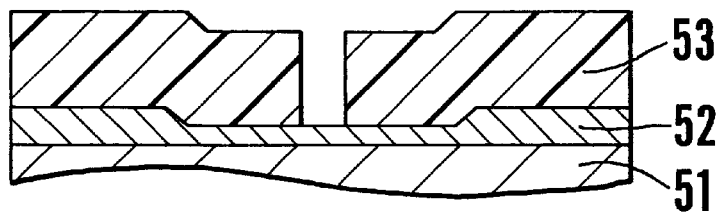

As shown in FIG. 7B, the first insulating film 53 is selectively patterned by dry etching using $SF_6$ gas and, as a mask, the resist film 54 to transfer the pattern opening portion 59, and the resist film 54 is removed. At this time, the pattern opening portion 59 of this embodiment becomes about 0.2 $\mu$m. Next, a Schottky metal film 55, a barrier metal film 56, and a low-resistance metal film 57, which form a gate electrode, are sequentially formed on the entire surface by sputtering.

In this embodiment, a WSi film having a thickness of 200 nm is formed as the Schottky metal film 55. The Schottky metal film 55 is formed to be particularly thick at the upper side wall of the pattern opening portion 59 having a trench structure such that the opening width narrows down at that portion. For example, sputtering with a small distance between the sputtering source and the wafer on which the film is to be formed is used to increase the sputtering particles which become incident on the wafer at a small angle.

As the barrier metal film 56, a TiN film having a thickness of 100 nm is formed by, e.g., sputtering. In this embodiment, the barrier metal film 56 may be thinner or may be omitted.

The low-resistance metal film 57 is formed from Au to have a thickness of 500 nm by sputtering or plating.

Figure 7C:
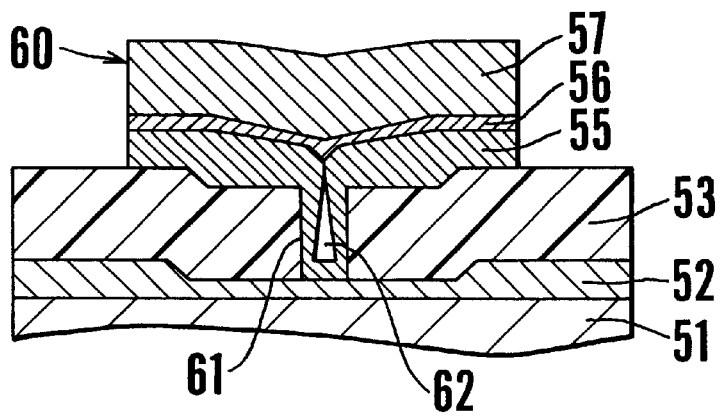
Figure 8:
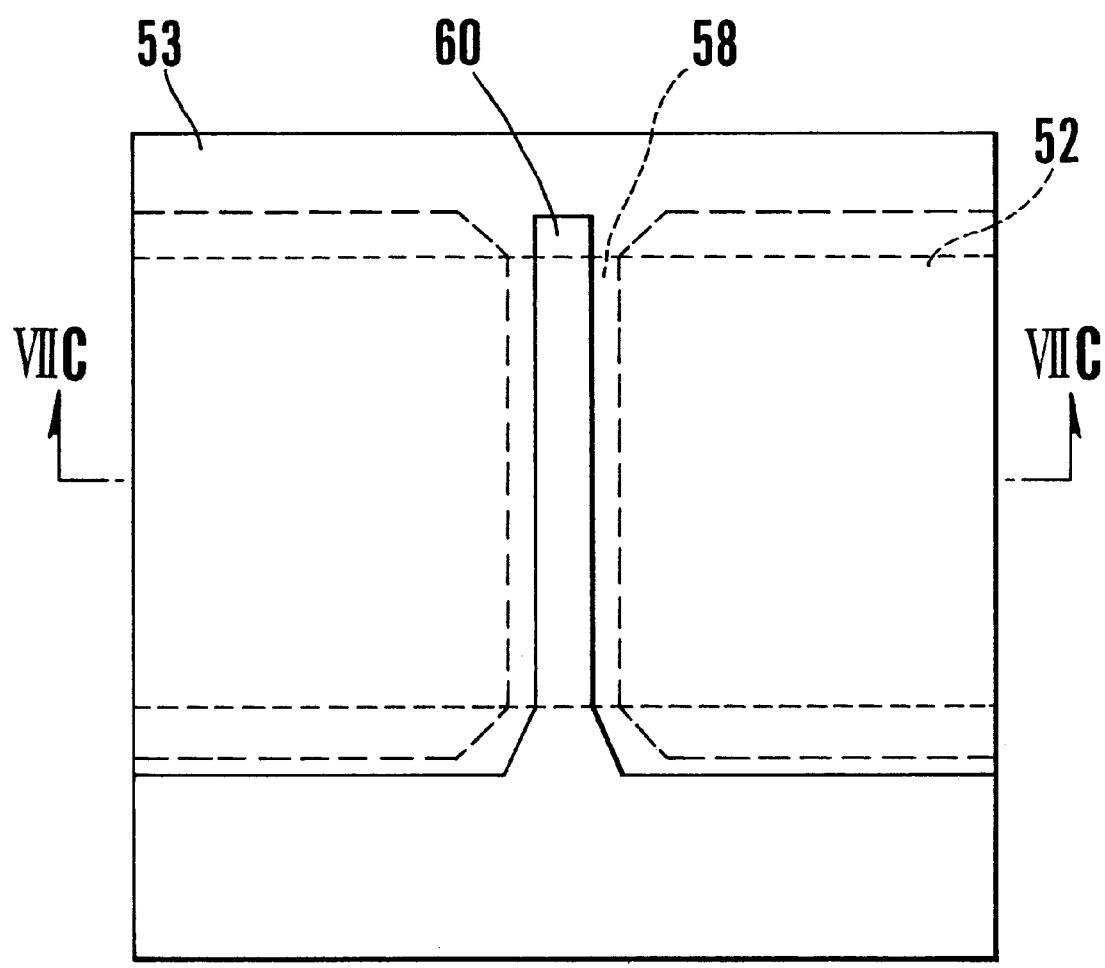
FIG. 8 is a schematic plan view showing the third embodiment of the present invention.

Unnecessary portions of the Schottky metal film 55, the barrier metal film 56, and the low-resistance metal film 57 are sequentially selectively removed by ion milling and dry etching using a resist pattern as a mask, thereby obtaining a T-shaped gate electrode 60, as shown in FIGS. 7C and 8. FIG. 7C is an enlarged view of a section taken along a line VIIC—VIIC in FIG. 8.

The structure of the electrode formed by the method of this embodiment is shown in FIGS. 7C and 8. In this embodiment, a gate vertical portion 61 has a gate length of 200 nm, a height of 200 nm, and an aspect ratio of roughly 1:1. Only the Schottky metal film 55 is formed in the gate vertical portion 61, and a gap 62 having a width of 100 nm and a height of 150 nm is formed at the center of the gate vertical portion 61. The gap 62 is closed at its upper and lower portions by the Schottky metal film 55, so the barrier metal layer 56 and the low-resistance metal film 57 on the Schottky metal film 36 do not extend into the gate vertical portion 61.

What is claimed is:

1. A semiconductor device having a structure in which a gate electrode is formed by sequentially forming a Schottky metal film, wherein a barrier metal film, and a low-resistance metal film from a lower side, said Schottky metal film or barrier metal film has a gap in a lower gate vertical portion, the gap is closed at upper and lower portions, and the overlaying low-resistance metal film does not extend into said lower gate vertical portion.

2. A semiconductor device having a structure in which a gate electrode is formed by sequentially forming a Schottky metal film and a low-resistance metal film from a lower side, wherein said Schottky metal film has a gap in a lower gate vertical portion, the gap is closed at upper and lower portions, and the overlaying low-resistance metal film does not extend into said lower gate vertical portion.

* * * * *